(12) United States Patent
Li et al.

(10) Patent No.: US 11,114,497 B2
(45) Date of Patent: Sep. 7, 2021

(54) SENSOR, ARRAY SUBSTRATE CONTAINING SENSOR, DISPLAY PANEL CONTAINING ARRAY SUBSTRATE

(71) Applicant: BOE TECHNOLOGY GROUP CO., LTD., Beijing (CN)

(72) Inventors: Dongsheng Li, Beijing (CN); Huili Wu, Beijing (CN); Qingrong Ren, Beijing (CN); Shipei Li, Beijing (CN); Xuefei Sun, Beijing (CN); Dongsheng Yin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 29 days.

(21) Appl. No.: 16/332,932

(22) PCT Filed: Jul. 17, 2018

(86) PCT No.: PCT/CN2018/095996
§ 371 (c)(1),
(2) Date: Mar. 13, 2019

(87) PCT Pub. No.: WO2019/015588
PCT Pub. Date: Jan. 24, 2019

(65) Prior Publication Data
US 2019/0252456 A1    Aug. 15, 2019

(30) Foreign Application Priority Data

Jul. 18, 2017 (CN) .......................... 201710586621.6
Jan. 19, 2018 (CN) .......................... 201810054670.X
Jan. 31, 2018 (CN) .......................... 201810100921.3

(51) Int. Cl.
*H01L 27/146* (2006.01)
*H01L 27/144* (2006.01)
(Continued)

(52) U.S. Cl.
CPC ...... *H01L 27/14678* (2013.01); *G06K 9/0004* (2013.01); *H01L 27/144* (2013.01);
(Continued)

(58) Field of Classification Search
CPC ......... H01L 27/14678; H01L 31/02019; H01L 31/022408; H01L 27/14623;
(Continued)

(56) References Cited

U.S. PATENT DOCUMENTS 8,053,722 B1    11/2011    Asghari et al.
8,810,703 B2    8/2014    Machida
(Continued)

FOREIGN PATENT DOCUMENTS

CN    102208426 A    10/2011
CN    104977599 A    10/2015
(Continued)

OTHER PUBLICATIONS

Office Action, dated Mar. 12, 2020, issued in counterpart Chinese Patent Application No. 201810100921.3 (w/English translation; 13 pages).
(Continued)

*Primary Examiner* — Mouloucoulaye Inoussa
(74) *Attorney, Agent, or Firm* — Westerman, Hattori, Daniels & Adrian LLP

(57)    ABSTRACT

The present disclosure generally relates to the field of detection technology. A sensor includes a base substrate; a voltage dividing photodiode on the base substrate; and a detecting photodiode on the base substrate. The voltage dividing photodiode may include a first electrode and a second electrode arranged in a stack. The detecting photodiode may include a third electrode and a fourth electrode arranged in a stack. The voltage dividing photodiode is configured to operate substantially permanently in a dark
(Continued)

state. The detecting photodiode is configured to operate with a reverse bias applied by the first power terminal and the second power terminal, so as to detect a light intensity.

17 Claims, 26 Drawing Sheets

(51) Int. Cl.
*G06K 9/00* (2006.01)
*H01L 31/02* (2006.01)
*H01L 31/0216* (2014.01)
*H01L 31/0224* (2006.01)
*H01L 29/786* (2006.01)
*H01L 31/105* (2006.01)

(52) U.S. Cl.
CPC .. *H01L 27/14614* (2013.01); *H01L 27/14623* (2013.01); *H01L 27/14685* (2013.01); *H01L 27/14689* (2013.01); *H01L 31/02019* (2013.01); *H01L 31/02164* (2013.01); *H01L 31/022408* (2013.01); *G06K 9/00087* (2013.01); *H01L 29/7869* (2013.01); *H01L 29/78633* (2013.01); *H01L 31/105* (2013.01)

(58) Field of Classification Search
CPC ......... H01L 27/14689; H01L 27/14685; H01L 31/02164; H01L 27/14614; H01L 31/105; H01L 27/3244; H01L 27/14632; H01L 27/3234; H01L 27/14687; H01L 27/14692; G06K 9/0004; G06K 9/00087; G01T 1/244; G01T 1/24; G09G 3/3648; G06F 3/042; G06F 3/0412; G02F 1/13338; H04N 5/374

USPC ........... 257/225, 53, E27.128; 250/369, 216, 250/208.2, 370.09

See application file for complete search history.

(56) References Cited

U.S. PATENT DOCUMENTS

| | | | |
|---|---|---|---|
| 9,344,661 B2 | 5/2016 | Saito et al. | |
| 2009/0258456 A1 | 10/2009 | Hatai | |
| 2010/0110096 A1* | 5/2010 | Satoh | H01L 31/02164 345/589 |
| 2010/0155578 A1* | 6/2010 | Matsumoto | H01L 27/3244 250/216 |
| 2011/0169794 A1 | 7/2011 | Hara et al. | |
| 2012/0085890 A1* | 4/2012 | Kurokawa | H01L 27/14678 250/208.2 |

FOREIGN PATENT DOCUMENTS

| | | |
|---|---|---|
| CN | 106156753 A | 11/2016 |
| CN | 107256880 A | 10/2017 |
| CN | 108279028 A | 7/2018 |
| WO | 2010032632 A1 | 3/2010 |

OTHER PUBLICATIONS

Search Report and Written Opinion, dated Oct. 18, 2018, issued in counterpart International Application No. PCT/CN2018/095996 (9 pages; in English).

Office Action, dated Mar. 22, 2019, issued in counterpart Chinese Application No. 201710586621.6 (7 pages; w/English machine translation).

* cited by examiner

SENSOR, ARRAY SUBSTRATE CONTAINING SENSOR, DISPLAY PANEL CONTAINING ARRAY SUBSTRATE

CROSS-REFERENCE TO RELATED APPLICATIONS

This application claims the benefit of the filing dates of Chinese Patent Application No. 201810100921.3 filed on Jan. 31, 2018, Chinese Patent Application No. 201710586621.6 filed on Jul. 18, 2017, and Chinese Patent Application No. 201810054670.X filed on Jan. 19, 2018, the entire disclosure of each of which is hereby incorporated by reference.

TECHNICAL FIELD

The present disclosure generally relates to the field of detection technology, and in particular, to photoelectric sensing technology. The present disclosure relates to a sensor, an array substrate having a sensor, and a display panel.

BACKGROUND

Photoelectric sensing technology is developing rapidly. When photoelectric sensing technology is applied to fingerprint recognition, the basic operating principles are as follows: light emitted by a light source reaches a finger surface, and is reflected back to a light receiving surface of a photodiode in a fingerprint recognition element. The photodiode generates currents according to the received light. Because ridges and valleys of fingerprint have different distances to the photodiode, the current generated by the photodiode corresponding to a ridge of fingerprint is different from that generated by the photodiode corresponding to a valley of fingerprint. Therefore, the fingerprint recognition element in the display panel can determine the morphology of the fingerprint based on magnitudes of the currents generated by the photodiode.

BRIEF SUMMARY

One embodiment of the present disclosure is a sensor. The sensor may comprise a base substrate; a voltage dividing photodiode on the base substrate; and a detecting photodiode on the base substrate. The voltage dividing photodiode may comprise a first electrode and a second electrode arranged in a stack. The detecting photodiode may comprise a third electrode and a fourth electrode arranged in a stack. The first electrode may be electrically connected to a first power terminal. The second electrode may be electrically connected to the third electrode. The fourth electrode may be electrically connected to a second power terminal. The voltage dividing photodiode may be configured to operate substantially permanently in a dark state. The detecting photodiode may be configured to operate with a reverse bias applied by the first power terminal and the second power terminal, so as to detect a light intensity.

In some embodiments, the second electrode may be directly connected to the third electrode.

In some embodiments, the voltage dividing photodiode and the detecting photodiode may be arranged in a stack, and the voltage dividing photodiode may be arranged on a side of the detecting photodiode opposite from a light-detecting surface of the detecting photodiode.

In some embodiments, the second electrode may be between the first electrode and the detecting photodiode. The third electrode may be between the fourth electrode and the voltage dividing photodiode. At least one of the second electrode and the third electrode may be opaque.

In some embodiments, the second electrode and the third electrode may form a unitary structure.

In some embodiments, the detecting photodiode may substantially cover the voltage dividing photodiode.

In some embodiments, the voltage dividing photodiode may not cover the detecting photodiode.

In some embodiments, a light shielding layer may be provided on a light incident side of the voltage dividing photodiode.

In some embodiments, the first electrode and the third electrode may be provided on the light incident side of the voltage dividing photodiode and a light incident side of the detecting photodiode, respectively. The second electrode and the fourth electrode may be provided on a side of the voltage dividing photodiode and the detecting photodiode, respectively, opposite from the light incident side.

In some embodiments, the light shielding layer may be provided on a light incident side of the first electrode. In some embodiments, the first electrode may be configured as the light shielding layer.

In some embodiments, at least one of (i) the first electrode and the third electrode may be provided in the same layer, and (ii) the second electrode and the fourth electrode may be provided in the same layer.

In some embodiments, the sensor may further comprise a sensor transistor. A gate electrode of the sensor transistor may be electrically connected to the third electrode. At least one of (i) the gate electrode of the sensor transistor and the third electrode may be provided in the same layer, and (ii) the gate electrode of the sensor transistor and the second electrode may be provided in the same layer.

In some embodiments, the sensor transistor may be a double gate transistor. The double gate transistor may comprise a first gate electrode and a second gate electrode. The first gate electrode may be electrically connected to the third electrode. The second gate electrode may be electrically connected to the first power terminal.

The sensor may further comprise a first switch transistor. A source electrode of the first switch transistor may be electrically connected to the second power terminal. A drain electrode of the first switch transistor may be electrically connected to the fourth electrode.

Another embodiment of the present disclosure is an array substrate. The array substrate may comprise a plurality of the sensors as described above.

Another embodiment of the present disclosure is a display panel. The display panel may comprise an array substrate as described above.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1A:
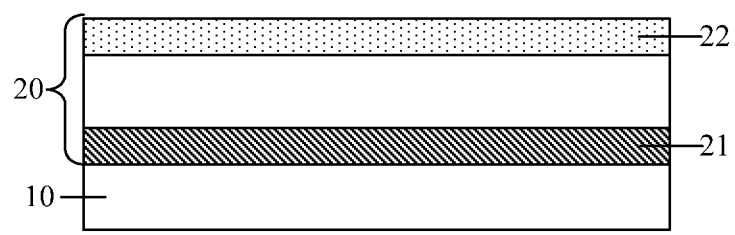
FIGS. 1a and 1b show schematic diagrams of sensors according to embodiments of the present disclosure.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function as the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

Display panels capable of touch-sensing functions generally rely on photoelectric sensing technology, for example, through the use of photodiodes, to perform fingerprint recognition. The basic operating principles of such photoelectric sensing technology for fingerprint recognition are as follows: light emitted by a light source reaches a finger surface, and is reflected back to a light receiving surface of a photodiode in a fingerprint recognition element. The photodiode generates currents according to the received light. Because ridges and valleys of fingerprint have different distances to the photodiode, the current generated by the photodiode corresponding to a ridge of fingerprint is different from that generated by the photodiode corresponding to a valley of fingerprint. Therefore, the fingerprint recognition element in the display panel can determine the morphology of the fingerprint based on magnitudes of the currents generated by the photodiode.

However, in a conventional fingerprint recognition element, a PIN diode used as a photodiode tends to generate weak currents. In addition, the PIN diode is generally connected to a thin film transistor (TFT), which generates an off-state current that is stronger in comparison to the optical currents generated by the PIN diode. As a result of the discrepancy between the current strengths, the combination of the PIN diode and the TFT often leads to excessive noise signals. The excessive noise makes the conventional technology unsatisfactory for use in gathering and processing optical signals, and therefore, inadequate for fingerprint recognition purposes.

The present disclosure generally provides a sensor, an array substrate, and a display panel, which may be provided with fingerprint recognition functionality. The sensor includes a resistor and a photodiode that are stacked and connected in series. As compared to a display panel that utilizes the conventional arrangement of a resistor and a photodiode in tandem and connected in series, the present disclosure makes it possible to reduce the amount of null area on the display panel, and increase the pixels-per-inch (PPI) value. A null area on the display panel refers to an area where detection cannot be effected. The present disclosure can thus increase the effective detection area of a sensor. Further, the present disclosure makes it possible to amplify the strength of photoelectric signals from a photodiode, and increase the detection efficiency of the sensor.

Figure 1B:
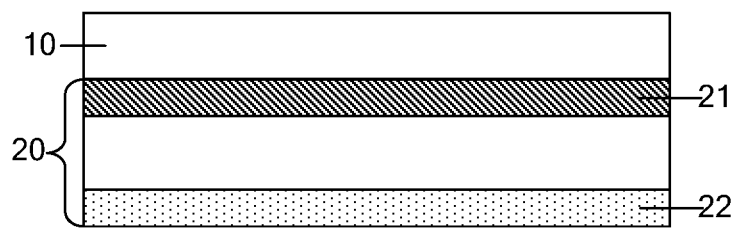
Figure 2:
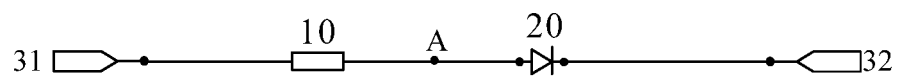
FIG. 2 shows an equivalent circuit of a sensor according to an embodiment of the present disclosure.

The present disclosure provides a sensor. As shown in FIGS. 1a, 1b, and 2, a resistor 10 and a second photodiode 20 are arranged in a stack on a base substrate (not shown). The resistor 10 and the second photodiode 20 are connected in series. The second photodiode 20 includes a third electrode 21 and a fourth electrode 22 arranged in a stack. In some embodiments, for example, as shown in FIG. 3b, the second photodiode 20 is a PIN photodiode comprising a N-type semiconductor 25 disposed on the fourth electrode 22, an I-type semiconductor 24 disposed on the N-type semiconductor 25, and a P-type semiconductor 23 disposed on the I-type semiconductor 24. A PIN photodiode has the advantages of having small junction capacitance, short transit time, and high sensitivity.

A first end of the resistor 10 is electrically connected to a first power terminal 31, and a second end of the resistor 10 is electrically connected to the third electrode 21. The fourth electrode 22 is electrically connected to the second power terminal 32. The second photodiode 20 may be a detecting photodiode configured to operate with a reverse bias applied by the first power terminal and the second power terminal, so as to detect a light intensity. More particularly, when the sensor according to the present disclosure is applied to fingerprint recognition, the second photodiode 20 is configured to operate with a reverse bias to detect the intensity of light reflected by a finger surface. The reverse bias is applied to the second photodiode 20 by the first power terminal 31 and the second power terminal 32. The second power terminal 32 may comprise a lower metal layer 321 and an upper metal layer 322. The metal layers 321, 322 of the second power terminal 32 may be composed of molybdenum (Mo), aluminum (Al), copper (Cu), and the like.

As shown in FIG. 2, when the first power terminal 31 and the second power terminal 32 apply a reverse bias on the second photodiode 20 (for example, when the first power terminal 31 applies a negative voltage and the second power terminal 32 applies a positive voltage), and the second photodiode 20 is in the dark state, the resistance of the second photodiode 20 increases, while the voltage at junction A in FIG. 2 (that is, the voltage of the third electrode 21) decrease. On the other hand, if the second photodiode 20 is in the bright state, the resistance of the second photodiode 20 decreases, while the voltage at junction A increases.

In other words, the second photodiode 20 is configured as a variable resistor. The voltage at junction A varies in accordance with the intensity of light reflected by the finger surface (and therefore, by the ridges and valleys of fingerprint on the finger surface) and detected by the second photodiode 20. Based on the voltage at junction A, the sensor can differentiate between light reflected by the ridges and valleys of the fingerprint, so as to achieve the fingerprint recognition functionality.

The second photodiode 20 is configured to detect intensity of light reflected by the finger surface. The second photodiode 20 is a PIN photodiode. The semiconductor component of the second photodiode 20 is configured to receive light reflected by the fingerprint. The second photodiode 20 is in the dark state when no light is detected. The second photodiode 20 is in the bright state when light is detected.

The arrangement of the resistor 10 relative to the second photodiode 20 depends on the transparent state of the resistor 10. When the resistor 10 is transparent, the resistor 10 is provided between the second photodiode and the base substrate (for example, as shown in FIG. 1a, the resistor 10 is on a side of the second photodiode 20 facing the base substrate (not shown)), or the second photodiode 20 is provided between the resistor 10 and the base substrate (for example, as shown in FIG. 1b, the resistor 10 is on a side of the second photodiode 20 opposite from the base substrate (not shown)). When the resistor 10 is not transparent, the resistor 10 is provided on a side of the second photodiode 20 facing the base substrate (that is, the resistor 10 is between the second photodiode 20 and the base substrate, as shown in FIG. 1a).

The resistor 10 is composed of a resistive material. The resistance of the resistor 10 is equal to, or substantially equal to, the resistance of the second photodiode 20. Resistive materials have conductive properties, so that the resistor 10 and the third electrode 21 of the second photodiode 20 may be in direct contact with each other.

The sensor according to the present disclosure is configured to provide fingerprint recognition functionality. In some embodiments, the sensor includes the resistor 10 and the second photodiode 20 arranged in a stack and connected in series. As compared to a display panel that utilizes the conventional arrangement of a resistor and a photodiode in tandem and connected in series, the present disclosure makes it possible to reduce the amount of null area on the display panel, and increase the pixels-per-inch (PPI) value. Further, the present disclosure makes it possible to design a circuit that is configured to amplify the strength of photoelectric signals from a photodiode, and when incorporated into a sensor, increase the detection efficiency of the sensor.

Figure 3A:
FIGS. 3a and 3b show schematic diagrams of sensors according to embodiments of the present disclosure.
Figure 3B:
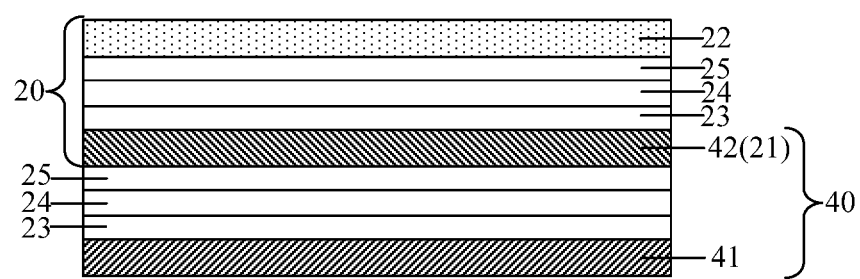

In some embodiments, for example, as shown in FIGS. 3a and 3b, a first photodiode 40 is used in place of the resistor 10. The first photodiode 40 is provided between the second photodiode 20 and the base substrate. The first photodiode is configured to operate substantially permanently in a dark state. The first photodiode 40 includes a first electrode 41 and a second electrode 42 arranged in a stack. The first electrode 41 is electrically connected to the first power terminal 31, and the second electrode 42 is electrically connected to the third electrode 21. In some embodiments, the second electrode 42 is not transparent. In some embodiments where the third electrode 21 covers the first photodiode 40, the third electrode 21 is not transparent.

In order for the second photodiode 20 to be in the dark state when no light is detected, and in the bright state when light is detected, the fourth electrode 22 of the second photodiode 20 is transparent. Further, in order for the first photodiode 40 to be in a permanent dark state (that is, in an OFF state), the second electrode 32 of the first photodiode is not transparent, or in embodiments where the third electrode 21 covers the first photodiode 40, the third electrode 21 is not transparent.

Figure 4:
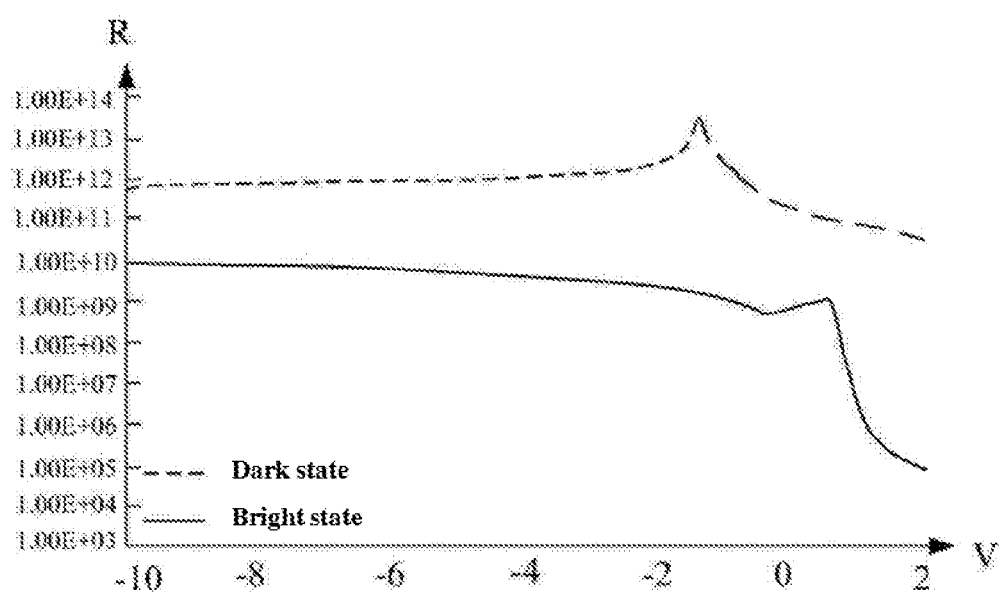
FIG. 4 shows a graph illustrating resistance as a function of voltage in a photodiode, either in the dark state (dashed line) or in the bright state (solid line), according to an embodiment of the present disclosure.

FIG. 4 shows a graph illustrating resistance as a function of voltage in a second photodiode according to embodiment of the present disclosure. Dashed line represents the resistance of the second photodiode in the dark state. Solid line represents the resistance of the second photodiode in the bright state. As shown in FIG. 4, when the voltage applied to the second photodiode is equal, the resistance of the second photodiode is increased in the dark state, and is significantly reduced in the bright state.

Figure 5:
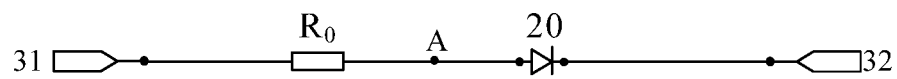
FIGS. 5 and 6 show equivalent circuits of sensors according to embodiments of the present disclosure.

FIG. 5 shows an equivalent circuit of a first photodiode 40 and a second photodiode 20 according to embodiments of the present disclosure. The first photodiode 40 is in a permanent dark state (that is, in an OFF state). The first photodiode 40 may be configured to have a fixed resistance ($R_0$), that is, as a fixed resistor. Meanwhile, the second photodiode 20 is configured to operate with a reverse bias, and is configured as a variable resistor. As shown in FIG. 5, when a reverse bias is applied to the two terminuses of the equivalent circuit of the first photodiode 40 and the second photodiode 20, and the second photodiode 20 is in the dark state, the resistance of the second photodiode 20 is increased (equal to $R_0$) and the voltage at junction A is decreased. On the other hand, when the second photodiode 20 is in the bright state, the resistance of the second photodiode 20 is decreased, and the voltage at junction A is correspondingly increased.

In other words, the voltage at junction A varies in accordance with the intensity of light reflected by the finger surface (and therefore, by the ridges and valleys of fingerprint on the finger surface) and detected by the second photodiode 20. Based on the voltage at junction A, the sensor can differentiate between light reflected by the ridges and valleys of the fingerprint, so as to achieve the fingerprint recognition functionality.

FIGS. 3a and 3b show schematic diagrams of sensors according to embodiments of the present disclosure. As shown in FIG. 3b, the first photodiode 40 and the second photodiode 20 may each be a PIN photodiode. More particularly, the first photodiode 40 includes a first electrode 41, a second electrode 42, a P-type semiconductor 23 between the first electrode 41 and the second electrode 42, an I-type semiconductor 24 on the P-type semiconductor 23, and a N-type semiconductor 25 on the I-type semiconductor 24.

The P-type semiconductor 23 is disposed to be closer to the first electrode 41, and the N-type semiconductor 25 is disposed to be closer to the second electrode 42.

The second photodiode 20 includes the third electrode 21, the fourth electrode 22, a P-type semiconductor 23 between the third electrode 21 and the fourth electrode 22, an I-type semiconductor 24 on the P-type semiconductor 23, and a N-type semiconductor 25 on the I-type semiconductor 24. The P-type semiconductor 23 is disposed to be closer to the third electrode 21, and the N-type semiconductor 25 is disposed to be closer to the fourth electrode 22.

The first photodiode 40 and the second photodiode 20 are arranged in a stack. The second electrode 42 (of the first photodiode 40) and the third electrode 21 (of the second photodiode 20) are electrically connected. In some embodiments, a single common electrode constitutes the second electrode 42 and the third electrode 21. For example, as shown in FIGS. 3a and 3b, only the second electrode 42 may be provided, and the second electrode 42 may additionally function as the third electrode 21.

By using a photodiode that is in a permanent OFF state in place of the resistor 10, the present disclosure makes it possible to apply the same process to fabricate the first photodiode 40 and the second photodiode 20. This can simplify considerably the fabrication process.

Figure 6:
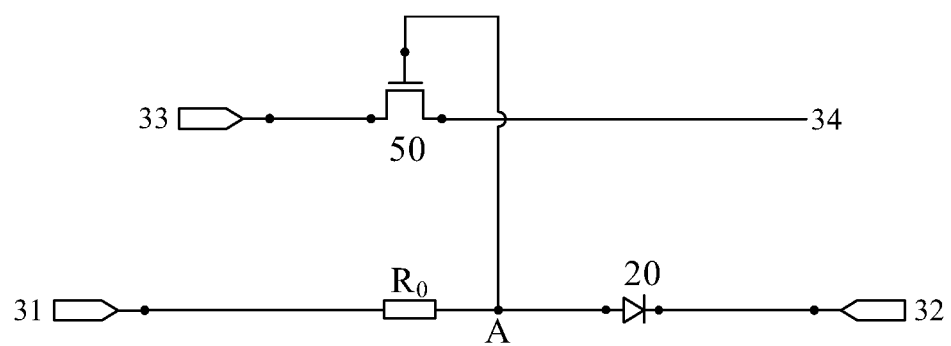

The sensor may further include a sensor transistor. FIG. 6 shows an equivalent circuit in a sensor according to an embodiment of the present disclosure. As shown in FIG. 6, the sensor transistor 50 may include a first gate electrode, a first TFT electrode, and a second TFT electrode. The first gate electrode of the sensor transistor 50 is electrically connected to the third electrode 21 of the second photodiode 20. The first TFT electrode of the sensor transistor 50 is electrically connected to the third power terminal 33, and the second TFT electrode of the sensor transistor 50 is electrically connected to a read signal line 34. The read signal line 34 is connected to the drain electrode of the sensor transistor 50, and is configured to read out the signal from the drain electrode of the sensor transistor 50. The sensor transistor 50 is configured to output current to the read signal line 34 in accordance with the third electrode 21 of the second photodiode 20 (that is, the voltage at junction A).

The second photodiode 20 is in a dark (OFF) state when no light is detected. In the dark state, the resistance of the second photodiode 20 is increased, whereas in the bright state, the resistance of the second photodiode 20 is decreased, which increases the voltage of the third electrode 21 (that is, the voltage at the junction A) and drives the sensor transistor 50. The sensor transistor 50 outputs a current to the read signal line 34 in accordance with the voltage signals received from the third power terminal 33. The output current from the sensor transistor 50 depends on the voltage at the junction A, and the voltage at the junction A in turn depends on the intensity of light reflected by the finger surface and detected by the second photodiode 20.

The basic operating principles of such photoelectric sensing technology for fingerprint recognition are as follows: light emitted by a light source reaches a finger surface, and is reflected. The reflected light is detected by a photodiode. The photodiode generates a current according to the received reflected light. Ridges and valleys of a fingerprint exhibit different refractive indices, so that the light reflected by the ridges has a different intensity from the light reflected by the valleys. As a result, the current generated by the sensor in response to the detected reflected light is also different for lights reflected by the ridges and the valleys.

The sensor can determine the morphology of the fingerprint based on magnitudes of the currents generated by the photodiode.

The sensor transistor 50 may be an oxide thin film transistor, such as an in IGZO (indium-gallium-zinc-oxide) thin film transistor, or the like.

Figure 7:
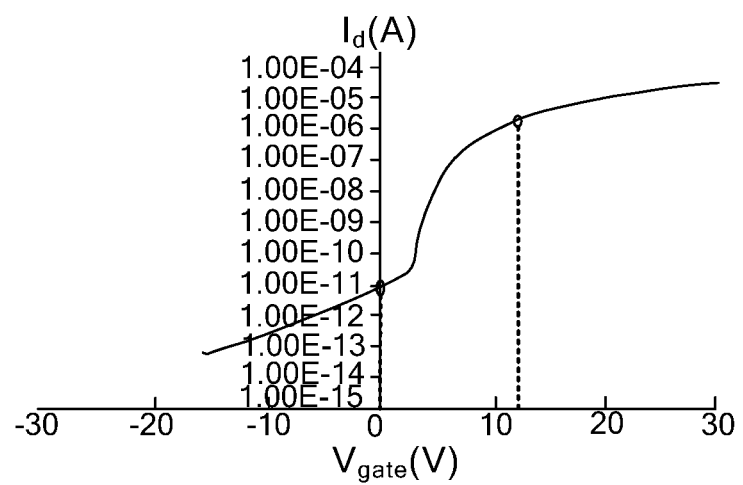
FIG. 7 shows a volt-ampere curve of a transistor for a sensor according to an embodiment of the present disclosure.

FIG. 7 shows a volt-ampere curve of a transistor for a sensor according to an embodiment of the present disclosure. More particularly, when the first gate electrode of the sensor transistor 50 varies between −30V and 30V, the variations can be plotted on a voltage-ampere (IV) curve as shown in FIG. 7. In FIG. 7, the output current $I_d$ of the sensor transistor 50 is a direct function of the voltage $V_{gate}$ of the first gate electrode, and therefore, of the voltage at junction A. When the voltage at junction A increases, the output current of the sensor transistor 50 also increases.

As an illustration, assuming that the two terminuses of the first photodiode 40 and the second photodiode 20 are subject to a ±15 V reverse bias (for example, a voltage of −15 V is applied to the first power terminal 31 and a voltage of +15 V is applied to the second power terminal 32). When the second photodiode 20 is in the dark state, and therefore in an OFF state, the resistance of the second photodiode 20 is equal to $R_0$, and the voltage at junction A is 0 V and the sensor transistor 50 is turned off. When the resistance of the second photodiode 20 decreases as a result of the second photodiode 20 being induced into the bright state, the voltage at junction A may be increased to 12 V and the sensor transistor 50 is turned on. As shown in FIG. 7, the change in voltage at junction A would cause the voltage at the first gate electrode of the sensor transistor 50 to increase from 0 V to 12 V, and the output current $I_d$ to increase by nearly five (5) orders of magnitude. In other words, the switching ratio of the sensor transistor 50 is increased by nearly five (5) orders of magnitude. The sensor according to the present disclosure is thus configured to amplify the strength of photoelectric signals from the second photodiode. The switching ratio of the sensor transistor 50 is the ratio of output current when the sensor transistor 50 is on to the ratio of output current when the sensor transistor 500 is off, and reflects the operating status of the sensor transistor 50. The larger the switching ratio is, the larger the operating current of the sensor transistor 50 is, and also the smaller the leakage current of the sensor transistor 50 is. Signal to noise ratio is also higher, which facilitates the detection of signals.

According to the present disclosure, the sensor transistor 50 outputs a larger current when driven by the voltage signals from the third power terminal 33. The effect of the leakage current inherent to the sensor transistor 50 on the output current is negligible. As a result, the present disclosure makes it possible to increase remarkably the accuracy and precision of fingerprint recognition based on the output current of the sensor transistor 50.

Figure 8:
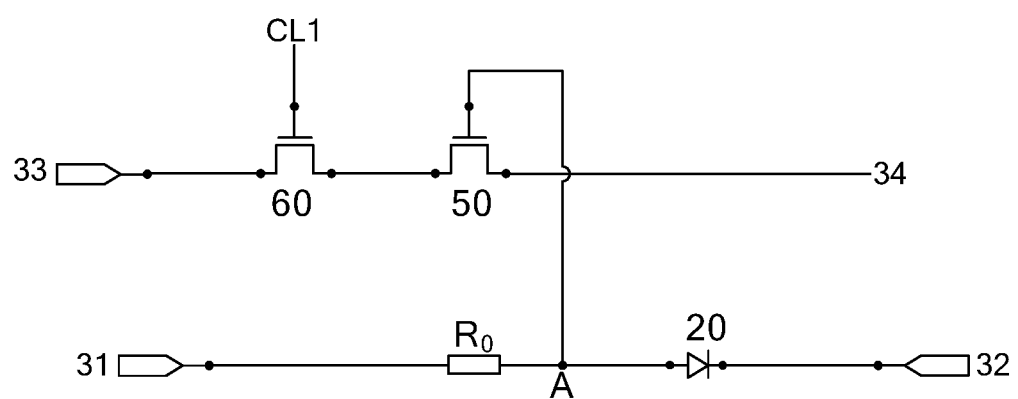
FIGS. 8 and 9 show equivalent circuits of a sensor according to embodiments of the present disclosure.

In some embodiments of the present disclosure, the sensor may also include a second switch transistor. FIG. 8 shows an equivalent circuit of a sensor according to an embodiment of the present disclosure. As shown in FIG. 8, the second switch transistor 60 may include a second gate electrode, a third TFT electrode, and a fourth TFT electrode. The third TFT electrode of the second switch transistor 60 is electrically connected to the third power terminal 33, and the fourth TFT electrode of the second switch transistor 60 is electrically connected to the first TFT electrode of the sensor transistor 50. The third power terminal 33 is configured to provide a fixed voltage.

The second gate electrode of the second switch transistor 60 may be electrically connected to the first control line CL1.

In the second switch transistor 60, the third TFT electrode may be a source electrode, and the fourth TFT electrode may be a drain electrode. In some embodiments, the third TFT electrode may be the drain electrode, and the fourth TFT electrode may be the source electrode.

Similarly, in the sensor transistor 50, the first TFT electrode may be the source electrode, and the second TFT electrode may be the drain electrode. In some embodiments, the first TFT electrode is the drain electrode, and the second TFT electrode is the source electrode.

The second switch transistor 60 and the sensor transistor 50 may be a N-type transistor or a P-type transistor. The second switch transistor 60 and the sensor transistor 50 may be TFTs of the same or different types.

The second switch transistor 60 may be disposed between the sensor transistor 50 and the third power terminal 33, which makes it possible to control the electrical connection between the third power terminal 33 and the first TFT electrode of the sensor transistor 50 in accordance with the control of the first control line CL1. In other words, the third power terminal 33 may be configured to provide a fixed voltage. On the other hand, if the sensor does not include the second switch transistor 60, then a timing voltage signal must be transmitted to the third power terminal 33, so that the proper voltage signal may be provided to the first TFT electrode of the sensor transistor 50 during light detection.

Figure 9:
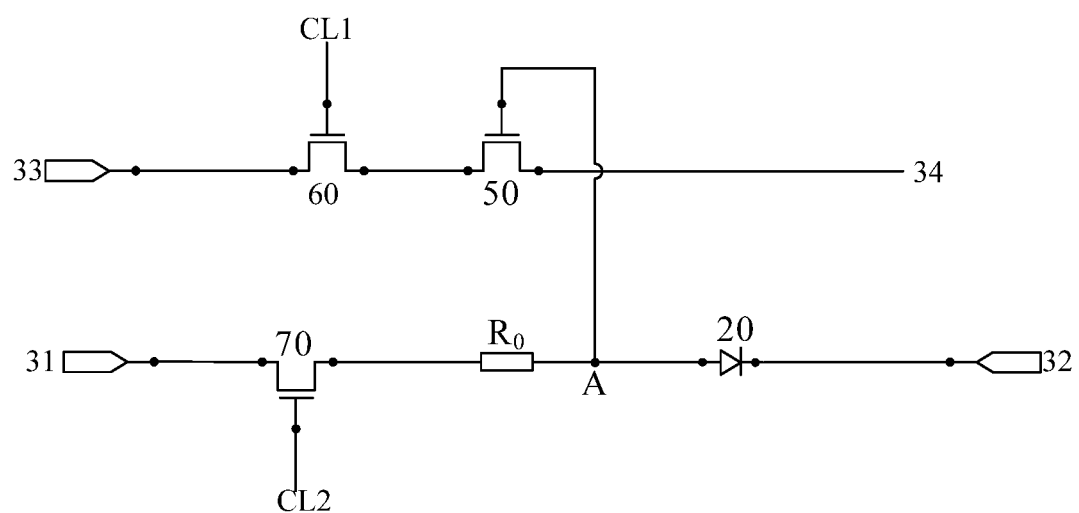

In some embodiments, the sensor may further include a third switch transistor. FIG. 9 shows an equivalent circuit of a sensor according to an embodiment of the present disclosure. As shown in FIG. 9, the third switch transistor 70 includes a third gate electrode, a fifth TFT electrode, and a sixth TFT electrode. The fifth TFT electrode of the third switch transistor 70 is electrically connected to the first power terminal 31, and the sixth TFT electrode of the third switch transistor 70 is electrically connected to one end of the resistor 10. The first power terminal 31 and the second power terminal 32 are configured to provide a fixed voltage.

The third gate electrode may be electrically connected to the second control line CL2. When the first photodiode 40 is used in place of the resistor 10, the sixth TFT electrode and the first electrode of the first photodiode 40 are electrically connected.

In the third switch transistor 70, the fifth TFT electrode may be the source electrode, and the sixth TFT electrode may be the drain electrode. In some embodiments, the fifth TFT electrode is the drain electrode, and the sixth TFT electrode is the source electrode. The third switch transistor 70 may be a N-type transistor or a P-type transistor.

The third switch transistor 70 makes it possible to control the electrical connection between the first power terminal 31 and the resistor 10 (or the first electrode of the first photodiode 40) in accordance with the control of the second control line CL2. In other words, the first power terminal 31 and the second power terminal 32 may be configured to provide a fixed voltage. On the other hand, if the sensor does not include the third switch transistor 70, then a timing voltage signal must be transmitted to the first power terminal 31 and the second power terminal 32, so that the appropriate reverse bias may be applied to the sensor during light detection.

Figure 10:
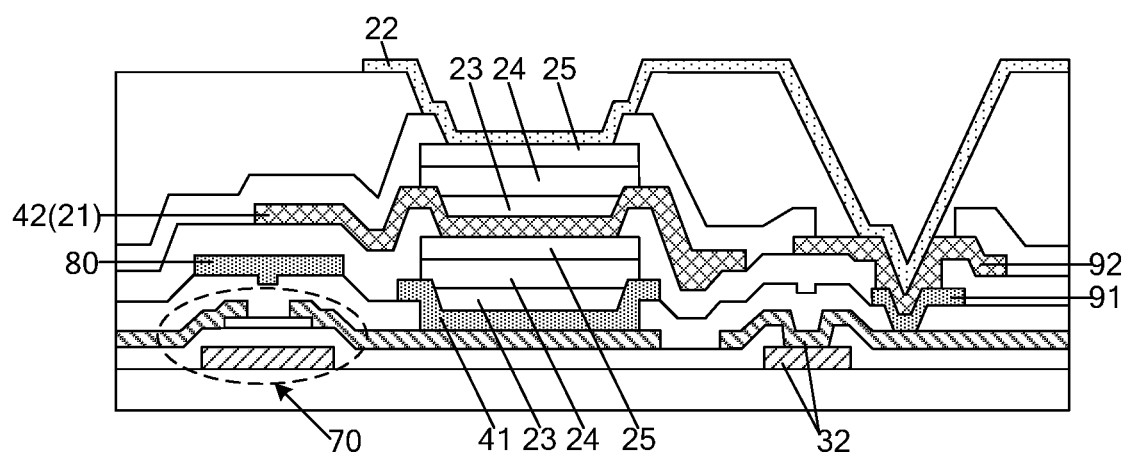
FIGS. 10 and 11 show schematic diagrams of a first photodiode, a second photodiode, and a third switch transistor in sensors according to embodiments of the present disclosure.
Figure 11:
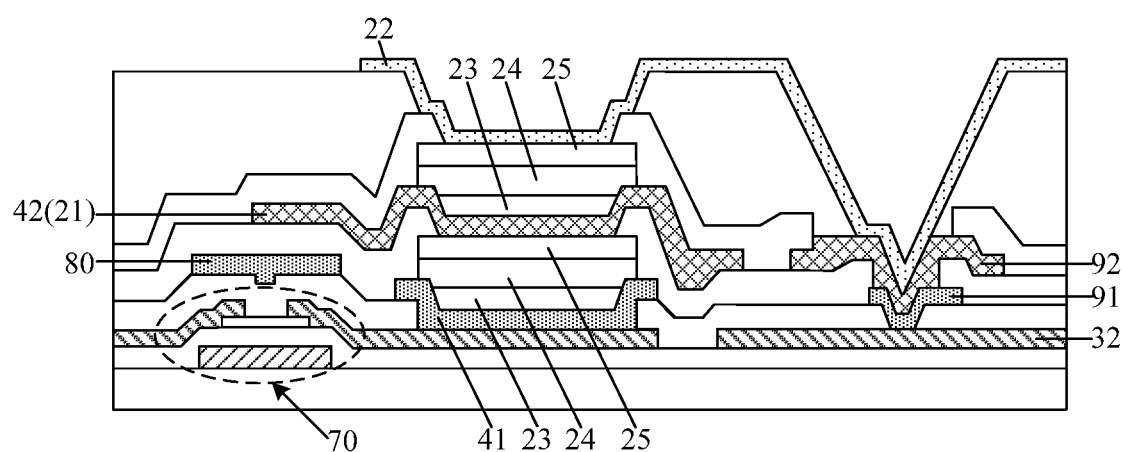

FIGS. 10 and 11 show schematic diagrams of a first photodiode, a second photodiode, and a third switch transistor in sensors according to embodiments of the present disclosure.

As shown in FIGS. 10 and 11, the first photodiode 40 and the first electrode 41 are provided in the same layer as a light shielding layer 80 configured to block the TFT channel. Providing the first electrode 41 of the first photodiode 40 in the same layer as the light shielding layer 80 can reduce the amount of patterning necessary to produce the sensor, which can in turn simplify the fabrication process.

The light shielding layer 80 functions to prevent light from being irradiated onto the TFT channel, so as to prevent the TFT from malfunctioning. The light shielding layer 80 is provided on the TFT of the bottom gate structure. More particularly, in an embodiment of the sensor that includes the sensor transistor 50, the second switch transistor 60, and the third switch transistor 70, if one or more of those TFT structures 50, 60, 70 is arranged as the bottom gate structure, then the light shielding layer 80 may be provided on the TFT structure.

FIGS. 10 and 11 show only the third switch transistor 70 being arranged as the bottom gate structure, but not the sensor transistor 50 or the second switch transistor 60. However, in an embodiment where either or both of the sensor transistor 50 and the second switch transistor 60 are also arranged as the bottom gate structure, then a light shielding layer 80 would also be provided on a side of each of the sensor transistor 50 and the second switch transistor 60 opposite from the base substrate, so as to block the corresponding TFT channel.

Figure 12:
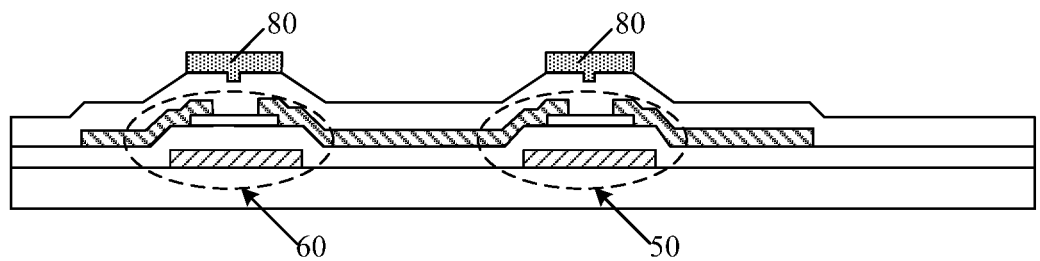
FIG. 12 shows a schematic diagram of a second switch transistor and sensor transistor in a sensor according to an embodiment of the present disclosure.
Figure 13:
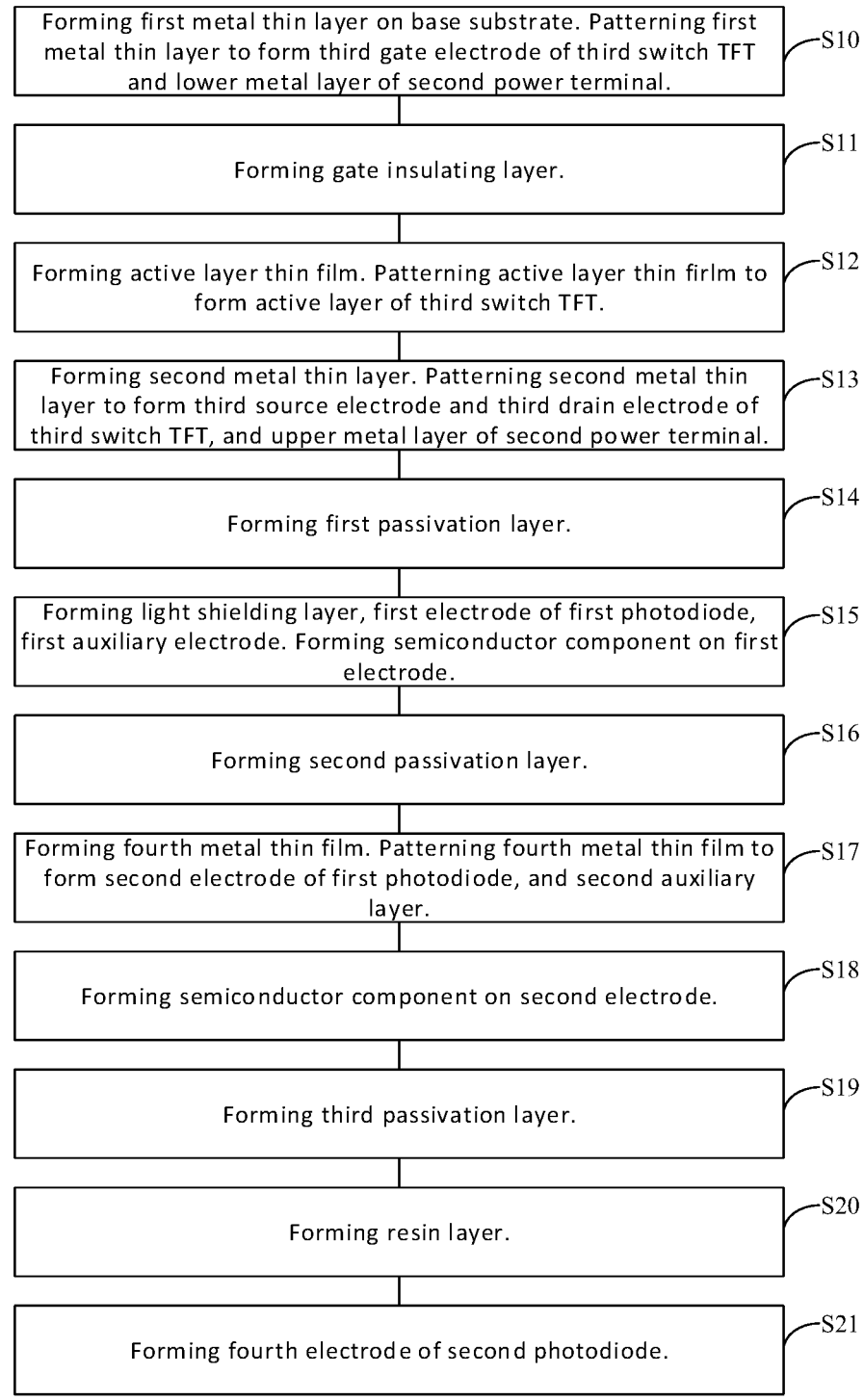
FIG. 13 shows a flow chart of a method of fabricating a sensor according to an embodiment of the present disclosure.

FIG. 12 shows a schematic diagram of a second switch transistor and sensor transistor in a sensor according to an embodiment of the present disclosure.

As shown in FIG. 12, when a sensor includes the sensor transistor 50 and a second switch transistor 60, the second gate electrode of the second switch transistor 60 and the first gate electrode of the sensor transistor 505 are disposed in the same layer. The third TFT electrode and the fourth TFT electrode of the second switch transistor 60 are disposed in the same layer as the first TFT electrode and the second TFT electrode of the sensor transistor 50. The read signal line 34 is disposed in the same layer as the first gate electrode of the sensor transistor 50 or as the first TFT electrode and the second TFT electrode of the sensor transistor 50. Such a configuration of the sensor can reduce the amount of patterning necessary to produce the sensor, which can in turn simplify the fabrication process. In the same layer means being manufactured through one patterning process.

In the embodiment illustrated in FIG. 12, the sensor transistor 50 and the second switch transistor 60 constitute the bottom gate structure. However, the bottom gate structure is not limited to the sensor transistor 50 and the second switch transistor 60. More particularly, the sensor transistor 50 and the second switch transistor 60 may constitute either the bottom gate structure, or the top gate structure.

When the sensor includes the third switch transistor 70, the third gate electrode of the third switch transistor 70 is disposed in the same layer as at least one of (i) the second gate electrode of the second switch transistor 60 and (ii) the third TFT electrode and the fourth TFT electrode of the second switch transistor 60. The fifth TFT electrode and the sixth TFT electrode of the third switch transistor 70 is disposed in the same layer as at least one of (i) the second gate electrode of the second switch transistor 60 and (ii) the third TFT electrode and the fourth TFT electrode of the second switch transistor 60. Such a configuration of the sensor can reduce the amount of patterning necessary to produce the sensor, which can in turn simplify the fabrication process.

When the third gate electrode of the third switch transistor 70 is disposed in the same layer as the second gate electrode of the second switch transistor 60, the fifth TFT electrode and the sixth TFT electrode of the third switch transistor 70 are disposed in the same layer as the third TFT electrode and the fourth TFT electrode of the second switch transistor 60.

When the third gate electrode of the third switch transistor 70 are disposed in the same layer as the third TFT electrode and the fourth TFT electrode of the second switch transistor 60, the fifth TFT electrode and the sixth TFT electrode of the third switch transistor 70 are disposed in the same layer as the second gate electrode of the second switch transistor 60.

When the first photodiode 40 is used in place of the resistor 10, the sensor may additionally include at least one of a first auxiliary electrode 91 and a second auxiliary electrode 92, for example, as shown in FIGS. 10 and 11. The fourth electrode 22 is electrically connected to the second power terminal 32 through at least one of the first auxiliary electrode 91 and the second auxiliary electrode 92. When the sensor includes the first auxiliary electrode 91, the first auxiliary electrode 91 and the first electrode 41 of the first photodiode 40 are disposed in the same layer. When the sensor includes the second auxiliary electrode 92, the second auxiliary electrode 92 is disposed in the same layer as the second electrode 42 of the first photodiode 40 and the third electrode 21 of the second photodiode 21.

The fourth electrode 22 of the second photodiode 21 is electrically connected to the second power terminal 32 through at least one of the first auxiliary electrode 91 and the second auxiliary electrode 92. The connection between the fourth electrode 22 and the second power terminal 32 may be configured in one of three configurations, for example, as shown in FIGS. 10 and 11. In the first configuration, the sensor includes only the first auxiliary electrode 91, and the fourth electrode 22 of the second photodiode 21 is electrically connected to the second power terminal 32 through the first auxiliary electrode 91. In the second configuration, the sensor includes only the second electrode 92, and the fourth electrode 22 of the second photodiode 21 is electrically connected to the second power terminal 32 through the second auxiliary electrode 92. In the third configuration, the sensor includes the first auxiliary electrode 91 and the second auxiliary electrode 92, and the fourth electrode 22 of the second photodiode 21 is electrically connected to the second power terminal 32 through the first auxiliary electrode 91 and the second auxiliary electrode 92.

In some embodiments, the electrodes of a TFT other than the gate electrode are disposed in the same layer.

Figure 15:
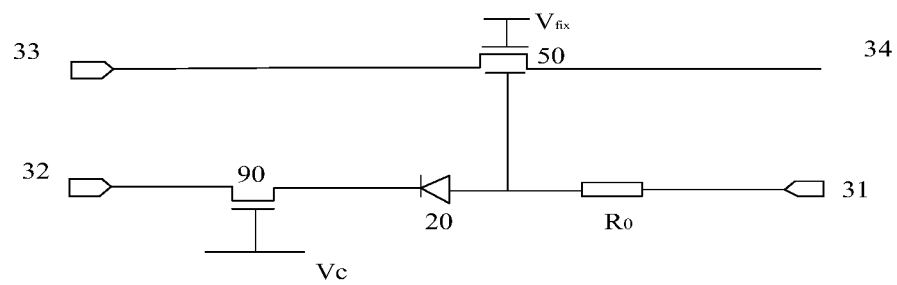
FIG. 15 shows an equivalent circuit of a sensor according to an embodiment of the present disclosure.
Figure 16:
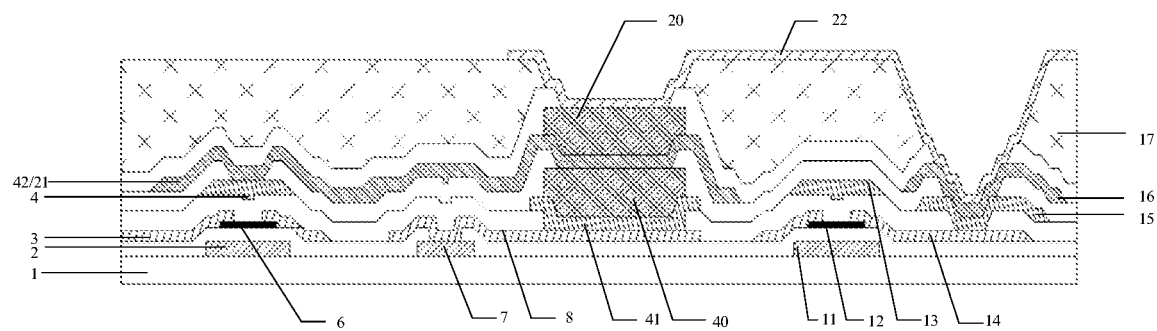
FIG. 16 shows a schematic diagram of a sensor according to the embodiment illustrated in FIG. 15.

FIG. 15 shows an equivalent circuit of a sensor according to an embodiment of the present disclosure. FIG. 16 shows a schematic diagram of a sensor according to the embodiment illustrated in FIG. 15.

The sensor comprises a base substrate 1; a voltage dividing photodiode 40 on the base substrate 1; and a detecting photodiode 20 on the base substrate 1. The voltage dividing photodiode 40 is configured to operate substantially permanently in a dark state. The detecting photodiode 20 is configured to operate with a reverse bias applied by the first power terminal and the second power terminal, so as to detect a light intensity.

The voltage dividing photodiode 40 comprises a first electrode 41 and a second electrode 42 arranged in a stack. The detecting photodiode 20 comprises a third electrode 21 and a fourth electrode 22 arranged in a stack. The first electrode 41 is electrically connected to a first power terminal. For example, as shown in FIG. 16, the first electrode 41 is electrically connected to the first power terminal via at least one signal line 7 and at least one connecting electrode 8. The second electrode 42 is electrically connected to the third electrode 21. In some embodiments, the second electrode 42 is directly connected to the third electrode 21, for example, as shown in FIG. 16. In some embodiments, the second electrode 42 and the third electrode 21 form a unitary structure (for example, as shown in FIG. 16), and the second electrode 42 and the third electrode 21 are formed in a single patterning process during fabrication. The fourth electrode 22 is electrically connected to a second power terminal (not shown).

In the embodiment illustrated in FIG. 16, the voltage dividing photodiode 10 and the detecting photodiode 20 are arranged in a stack. More particularly, the detecting photodiode 20 substantially covers the voltage dividing photodiode 40, and a projection of the detecting photodiode 20 perpendicularly onto the base substrate 1 corresponds, in terms of surface area and geometry, substantially to a projection of the voltage dividing photodiode 40 perpendicularly onto the base substrate 1. A projection of the detecting photodiode 20 perpendicularly onto the base substrate 1 has basically the same shape and same area with a projection of the voltage dividing photodiode 40 perpendicularly onto the base substrate 1 In some embodiments, the voltage dividing photodiode 40 covers an entirety of the detecting photodiode 20. The voltage dividing photodiode 40 is arranged on a side of the detecting photodiode 20 opposite from a light-detecting surface of the detecting photodiode 20. The second electrode 42 is between the first electrode 41 and the detecting photodiode 20. The third electrode 21 is between the fourth electrode 22 and the voltage dividing photodiode 10. Further, in embodiments where the voltage dividing photodiode 40 and the detecting photodiode 20 are arranged in a stack, at least one of the second electrode 42 and the third electrode 21 may be opaque. An electrode that is opaque has a low light transmittance, for example, at least 90% of the incident light is not transmitted.

As shown in FIG. 16, the sensor may further comprise a sensor transistor 50. The sensor transistor 50 comprises a gate electrode 2, 4 that is electrically connected to the third electrode 21, a source electrode and drain electrode 3, and an active layer 6. The gate electrode 2, 4 of the sensor transistor 50 and the third electrode 21 are provided in the same layer, and/or the gate electrode 2, 4 of the sensor transistor 50 and the second electrode 42 are provided in the same layer. The sensor transistor 50 may be a single gate transistor or a double gate transistor. When the sensor transistor 50 is a double gate transistor, the sensor transistor 50 comprises a first gate electrode 4 and a second gate electrode 2. The first gate electrode 4 is electrically connected to the third electrode 50, and the second gate electrode 2 is electrically connected to the fixed power terminal ($V_{fix}$), and preferably, the first power terminal. In some embodiments, a portion of the third electrode of the detecting photodiode covers at least a portion of the sensor transistor 50 and is configured to function as the first gate electrode of the sensor transistor 50. When the sensor transistor 50 is a double gate transistor, it is possible to connect one gate to a fixed power terminal $V_{fix}$, and another gate to the terminal of a signal line controlling the switching on and off of the transistor, for example, as shown in FIG. 15. This configuration in turn makes it possible to adjust the threshold voltage of the transistor using the fixed power terminal.

As shown in FIG. 16, the sensor may further comprise a first switch transistor 90. The first switch transistor 90 comprises a gate electrode 11, a source electrode 14 that is electrically connected to the second power terminal (not shown), a drain electrode 14 that is electrically connected to the fourth electrode 22, and an active layer 12. The first switch transistor 90 may be a single gate transistor or a double gate transistor. When the first switch transistor 90 is a double gate transistor, the first switch transistor 90 comprises a first gate electrode 11 and a second gate electrode 13. When the first switch transistor 90 is a single gate transistor, the first switch transistor 90 comprises a gate electrode 11 and a light shielding layer 13.

The sensor may further comprise a light shielding layer. The light shielding layer is provided on a light incident side of the voltage dividing photodiode 10. In some embodiments, when the sensor comprises a double gate transistor as the sensor transistor 50, the first gate electrode is electrically connected to the third electrode, and is configured to function as the light shielding layer.

The sensor may further comprise a first protective layer 15. The first protective layer 15 is composed of a conductive material. In some embodiments, the source and drain electrode 14 of the first switch transistor 90 and the second gate electrode/light shielding layer 13 of the first switch transistor 90 are composed of the similar material. The first protective layer 15 thus prevents the etching of the source and drain electrode 14 during the patterning of the second gate electrode/light shielding layer 13.

The sensor may further comprise a second protective layer 16. The second protective layer 16 is composed of a conductive material. In some embodiments, the second electrode 42, the third electrode 21, and the first protective layer 15 may be composed of similar material. The second protective layer 16 thus prevents the etching of the first protective layer 15 during patterning of the second electrode 42 and the third electrode 21.

Figure 17:
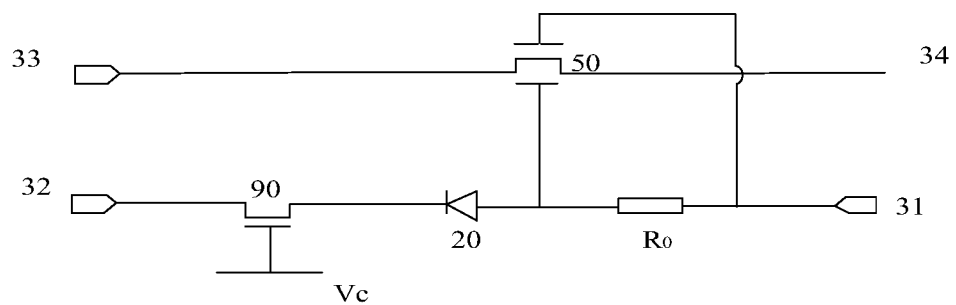
FIG. 17 shows an equivalent circuit of a sensor according to an embodiment of the present disclosure.
Figure 18:
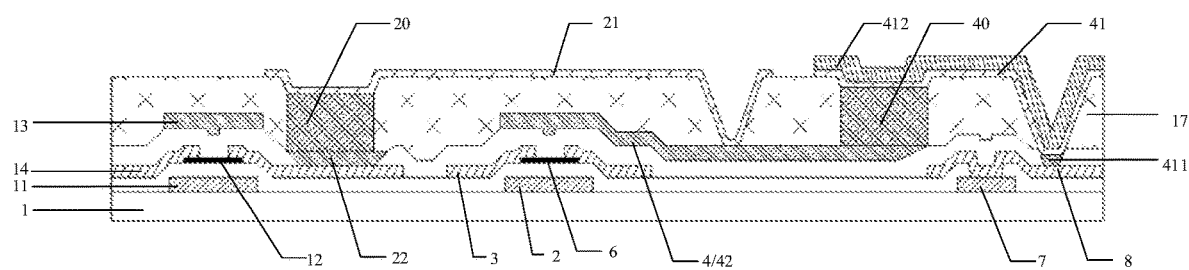
FIG. 18 shows a schematic diagram of a sensor according to the embodiment illustrated in FIG. 17.

FIG. 17 shows an equivalent circuit of a sensor according to an embodiment of the present disclosure. FIG. 18 shows a schematic diagram of a sensor according to the embodiment illustrated in FIG. 17.

The embodiment illustrated in FIGS. 17 and 18 differ from the embodiment illustrated in FIGS. 15 and 16, in that the voltage dividing photodiode 40 and the detecting photodiode 20 are not arranged in a stack. More particularly, the voltage dividing photodiode 40 does not cover the detecting photodiode 20. For example, as shown in FIG. 18, the voltage dividing photodiode 40 and the detecting photodiode 20 may be arranged side by side. The voltage dividing photodiode 40 comprises a first electrode 41 and a second electrode 42 arranged in a stack. The detecting photodiode 20 comprises a third electrode 21 and a fourth electrode 22 arranged in a stack. The first electrode 41 is electrically connected to a first power terminal. For example, as shown in FIG. 18, the first electrode 41 is electrically connected to the first power terminal via at least one signal line 7, at least one connecting electrode 8, and a protective layer 20. The first electrode 41 and the third electrode 21 are provided on the light incident side of the voltage dividing photodiode 40 and the light incident side of the detecting photodiode 20, respectively. The second electrode 42 and the fourth electrode 22 are provided on a side of the voltage dividing photodiode 40 and the detecting photodiode 20, respectively, opposite from the light incident side. The first electrode 41 and the third electrode 21 are provided in the same layer, and/or the second electrode 42 and the fourth electrode 22 are provided in the same layer.

A light shielding layer is provided on a light incident side of the voltage dividing photodiode 10. The light shielding layer is provided on a light incident side of the first electrode 41. In some embodiments, the first electrode 41 is configured as the light shielding layer.

As shown in FIG. 18, the sensor may further comprise a sensor transistor 50. The sensor transistor 50 comprises a gate electrode 4 that is electrically connected to the second electrode 42 and the third electrode 21, a source electrode and drain electrode 3, and an active layer 6. The sensor transistor 50 may be a single gate transistor or a double gate transistor. When the sensor transistor 50 is a double gate transistor, the sensor transistor 50 comprises a first gate electrode 4 and a second gate electrode 2. The second gate electrode 2 is electrically connected to the fixed power terminal ($V_{fix}$), for example, as shown in FIG. 15. Preferably, the second gate electrode 2 is electrically connected to the first power terminal. When the sensor transistor 50 is a single gate transistor, the sensor transistor 50 comprises a gate electrode 4 and a light shielding layer 2.

As shown in FIG. 18, the sensor may further comprise a first switch transistor 90. The first switch transistor 90 comprises a gate electrode 11, a source electrode and a drain electrode 14, and an active layer 12. The first switch transistor 90 may be a single gate transistor or a double gate transistor. When the first switch transistor 90 is a double gate transistor, the first switch transistor 90 comprises a first gate electrode 11 and a second gate electrode 13. When the first switch transistor 90 is a single gate transistor, the first switch transistor 90 comprises a gate electrode 11 and a light shielding layer 13.

The sensor may further comprise a protective layer 20. In some embodiments, the connection electrode 8, the gate electrode 4, and the second electrode 42 may be composed of similar material. The protective layer 15 thus prevents the etching of the connection electrode 8 during the patterning of the gate electrode 4 and the second electrode 42.

The present disclosure also provides an array substrate. The array substrate includes a plurality of the sensors as described above. The arrangement of the sensors in the array substrate is not particularly limited. For example, each pixel unit of the array substrate may comprise a sensor, or a portion of the pixel units may comprise a sensor.

The present disclosure also provides a display panel. The display panel includes an array substrate as described above.

It is understood that additional components and/or accessories may be provided within an array substrate or a display panel of the present disclosure without departing from the spirit and scope of the present disclosure. A person of ordinary skill in the art would readily appreciate that the configuration of an array substrate or a display panel is not limited to the embodiments described in this present disclosure or shown in the figures, and an array substrate or a display panel may include any additional components that are typically found in an array substrate and a display panel, respectively, and/or that are provided according to any particular purpose for which the array substrate and the display panel are intended.

The present disclosure also provides a method of fabricating a sensor. FIGS. 13 and 14a-14g illustrate a method of fabricating a sensor according to an embodiment of the present disclosure.

Figure 14A:
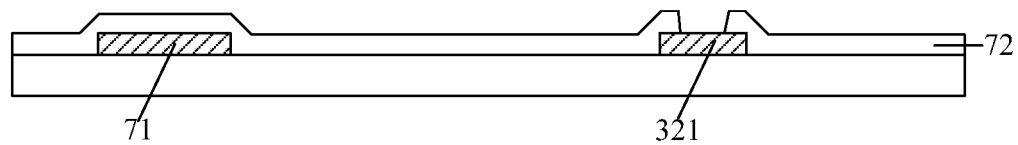
FIGS. 14a to 14g show schematic diagrams of a method of fabricating a sensor according to the embodiment illustrated in FIG. 13.

In step 10 (S10), a first metal thin film is formed on the base substrate. Patterning is performed to form the third gate electrode 71 of the third switch transistor 70 and the lower metal layer 321 of the second power terminal 32, for example, as shown in FIG. 14a. The third gate electrode 71 and the lower metal layer 321 may be formed in a single patterning process. In embodiments where the third switch transistor 70 is not provided, patterning is performed to form only the lower metal layer 321 of the second power terminal 32.

The first metal thin film may be composed of molybdenum (Mo), aluminum (Al), copper (Cu), and the like. The first metal thin film may comprise a single layer, or a plurality of layers.

In step 11 (S11), a gate insulating layer 72 is formed. The gate insulating layer 72 comprises at least one through-hole that exposes the lower metal layer 321 of the second power terminal 32, for example, as shown in FIG. 14a.

The gate insulating layer 72 may be composed of silicon nitride ($SiN_x$), silicon oxide ($SiO_x$), silicon oxynitride (SiON), and the like. The gate insulating layer 72 may comprise a single layer, or a plurality of layers.

Figure 14B:
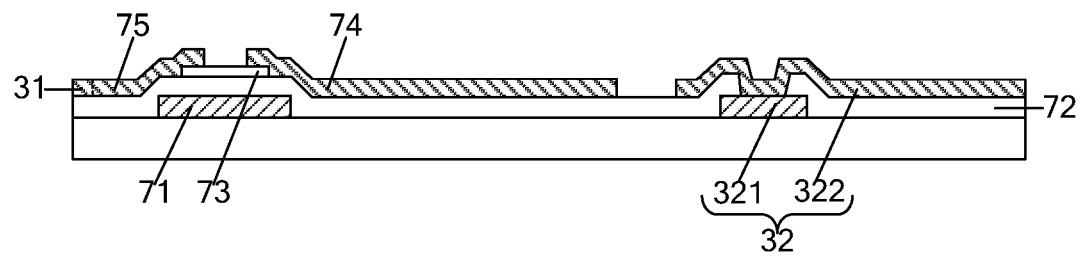

In step 12 (S12), an active layer thin film is formed. Patterning is performed to form the active layer 73 of the third switch transistor 70, for example, as shown in FIG. 14b. The active layer thin film may be composed of a semiconductor material, including IGZO (indium-gallium-zinc-oxide), silicon (Si), polysilicon (P—Si), and the like. The active layer 73 may be formed in a single patterning process.

In step 13 (S13), a second metal thin film is formed. Patterning is performed to form the third source electrode 74 and the third drain electrode 75 of the third switch transistor 70, and the upper metal layer 322 of the second power terminal 32, for example, as shown in FIG. 14b. The first power terminal 31 may also be formed in this step. The first power terminal 31 and the third drain electrode 75 are electrically connected.

The second metal thin film may be composed of molybdenum (Mo), aluminum (Al), copper (Cu), and the like. The second metal thin film may comprise a single layer, or a plurality of layers.

Following step 13, the third switch transistor 70 is completely formed. The third switch transistor 70 includes the third gate electrode 71, the gate insulating layer 72, the active layer 73, the third source electrode 74, and the third drain electrode 75.

If the structures of the sensor transistor 50 and the second switch transistor 60 are the same as the third switch transistor 70, then the sensor transistor 50 and the second switch transistor 60 may be formed concurrently as the third switch transistor 70.

Figure 14C:
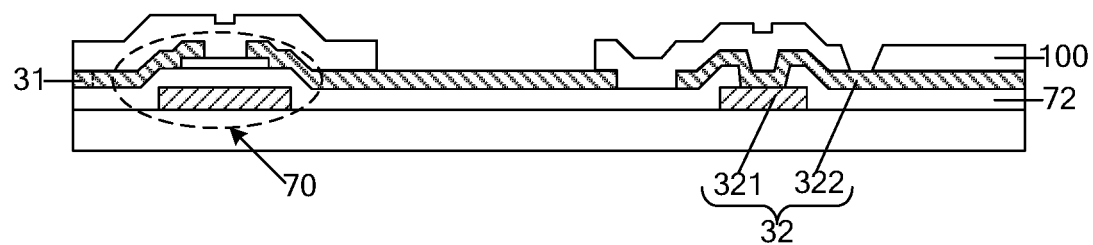

In step 14 (S14), a first passivation layer 100 is formed. The first passivation layer 100 includes an open region where the first photodiode 40 will be formed, and at least one through-hole that exposes the second power terminal 32, for example, as shown in FIG. 14c.

The first passivation layer 100 may be composed of silicon nitride ($SiN_x$), silicon oxide ($SiO_x$), silicon oxynitride (SiON), and the like. The first passivation layer 100 may comprise a single layer, or a plurality of layers.

Figure 14D:
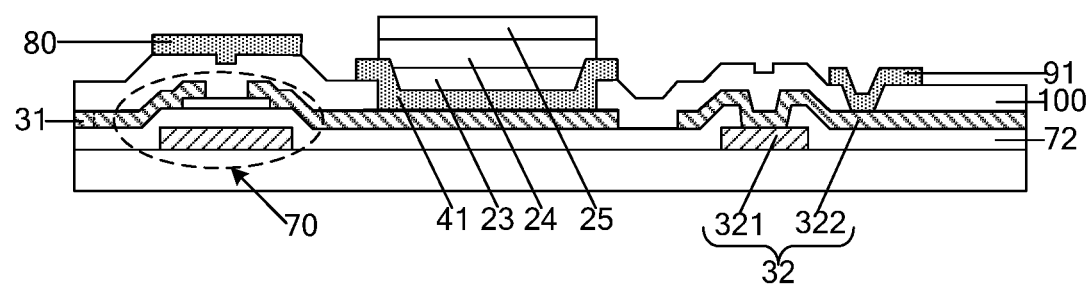

In step 15 (S15), the light shielding layer 80 is formed, for example, as shown in FIG. 14d. As shown in FIG. 14d, the first electrode 41 of the first photodiode 40 and the first auxiliary electrode 91 are also formed. The patterning process may be adjusted by any appropriate means known to a person of ordinary skill in the art, in order to obtain the desired pattern containing the desired structures (for example, in embodiments where the first auxiliary electrode 91 is not provided). The first electrode 41 and the first auxiliary electrode 91 are in the same layer as the light shielding layer 80. Also formed in this step are the P-type semiconductor 23, the I-type semiconductor 24, and the N-type semiconductor 25 on the first electrode 41. The P-type semiconductor 23, the I-type semiconductor 24, and the N-type semiconductor 25 formed in this step are associated with the first photodiode 40.

The first electrode 41 of the first photodiode 40 and the third source electrode 74 of the third switch transistor 70 may be in contact with each other in the open region of the first passivation layer 100, for example, as shown in FIG. 14d.

The light shielding layer 80, the first electrode 41 of the first photodiode 40, the first auxiliary electrode 91, the P-type semiconductor 23, the I-type semiconductor 24, and the N-type semiconductor 25 may be formed according to one of two processes.

In the first process, the third metal thin film is formed. A first patterning process is performed to form the light shielding layer 80, the first electrode 41 of the first photodiode 40, and the first auxiliary electrode 91. A second patterning process is performed to form the P-type semiconductor 23, the I-type semiconductor 24, and the N-type semiconductor 25.

In the second process, the third metal thin film, the P-type semiconductor thin film, the I-type semiconductor thin film, and the N-type semiconductor thin film are formed. A first patterning process is performed on the P-type semiconductor thin film, the I-type semiconductor thin film, and the N-type semiconductor thin film to form the P-type semiconductor 23, the I-type semiconductor 24, and the N-type semiconductor 25. A second patterning process is performed on the third metal thin film to form the light shielding layer 80, the first electrode 41 of the first photodiode 40, and the first auxiliary layer 91.

The third metal thin film may be composed of molybdenum (Mo), aluminum (Al), copper (Cu), and the like. The third metal thin film may comprise a single layer, or a plurality of layers.

Figure 14E:
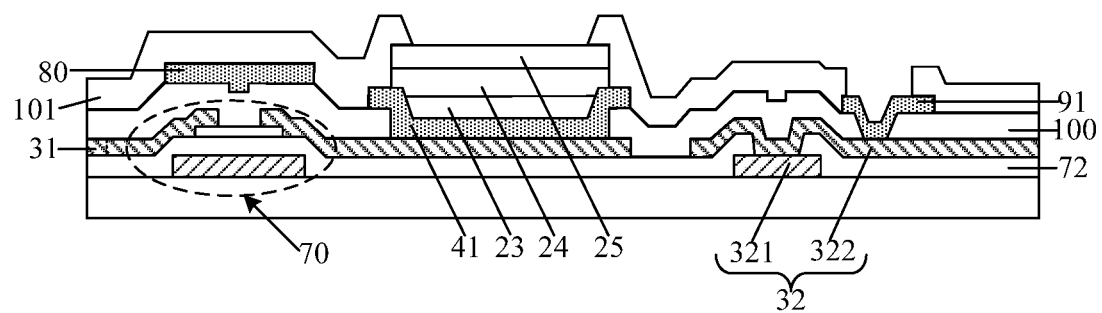

In step 16 (S16), the second passivation layer 101 is formed, for example, as shown in FIG. 14e. The second passivation layer 101 includes an open region that exposes the N-type semiconductor 25, for example, as shown in FIG. 14e. The second passivation layer 101 also includes at least one through-hole that exposes the first auxiliary layer 91.

The second passivation layer 101 may be composed of silicon nitride ($SiN_x$), silicon oxide ($SiO_x$), silicon oxynitride (SiON), and the like. The second passivation layer 101 may comprise a single layer, or a plurality of layers.

Figure 14F:
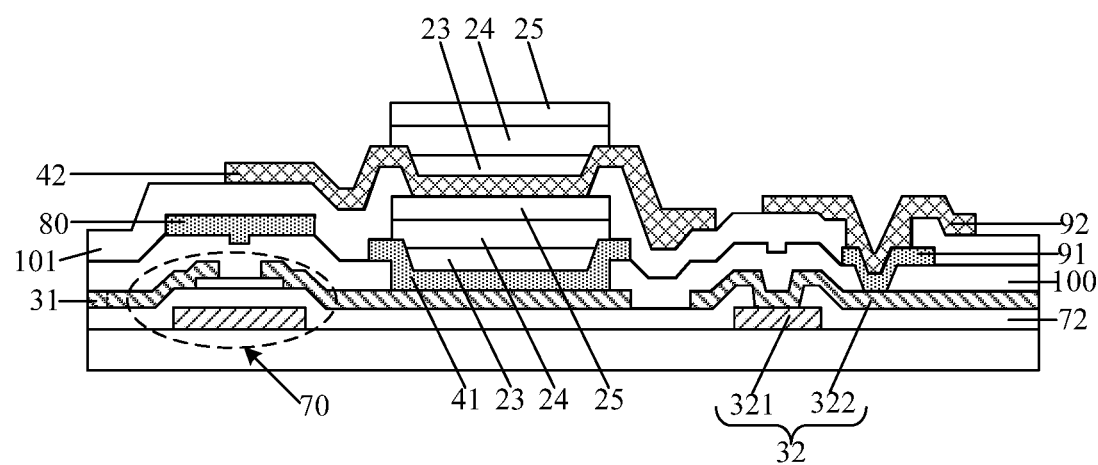

In step 17 (S17), the fourth metal thin film is formed, and then patterned to form the second electrode 42 of the first photodiode 40 and the second auxiliary layer 92, for example, as shown in FIG. 14f. The fourth metal thin film may be composed of molybdenum (Mo), aluminum (Al), copper (Cu), and the like. The fourth metal thin film may comprise a single layer, or a plurality of layers. It is understood that the patterning process may be adjusted by any appropriate means known to a person of ordinary skill in the art, in order to obtain the desired pattern containing the desired structures (for example, in embodiments where the second auxiliary electrode 92 is not provided).

Following step 17, the first photodiode 40 is completely formed. The first photodiode 40 includes the first electrode 41, the second electrode 42, and the semiconductor component (P-type semiconductor 23, I-type semiconductor 24, and N-type semiconductor 25) between the first electrode 41 and the second electrode 42.

In step 18 (S18), the P-type semiconductor 23, the I-type semiconductor 24, and the N-type semiconductor 25 are formed on the second electrode 42, for example, as shown in FIG. 14f. The P-type semiconductor 23, the I-type semiconductor 24, and the N-type semiconductor 25 formed in this step are associated with the second photodiode 20.

Figure 14G:
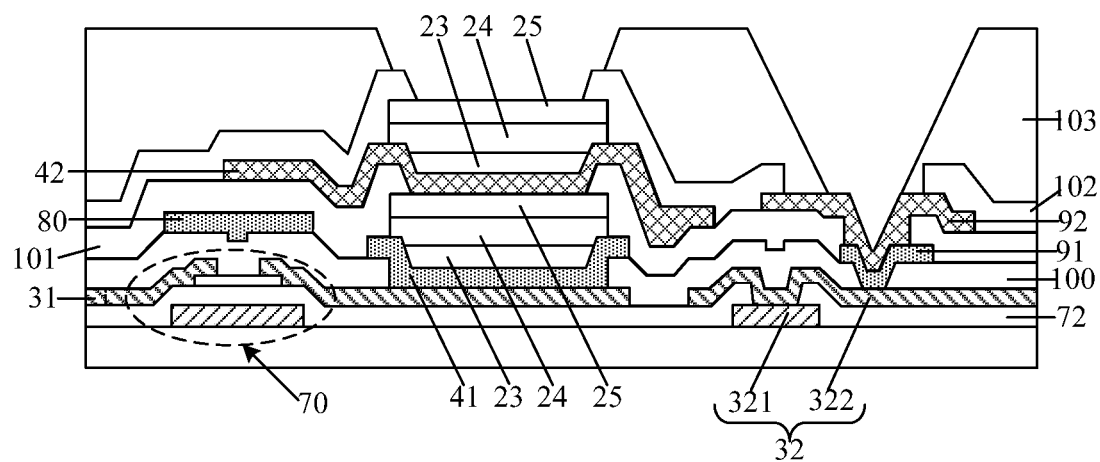

In step 19 (S19), the third passivation layer 102 is formed, for example, as shown in FIG. 14g. The third passivation layer 102 includes an open region that exposes the N-type semiconductor 25, for example, as shown in FIG. 14g. The third passivation layer 102 also includes at least one through-hole that exposes the second auxiliary layer 92.

The third passivation layer 102 may be composed of silicon nitride ($SiN_x$), silicon oxide ($SiO_x$), silicon oxynitride (SiON), and the like. The third passivation layer 102 may comprise a single layer, or a plurality of layers.

In step 20 (S20), the resin layer 103 is formed. The resin layer 103 includes an open region that exposes the N-type semiconductor 25, for example, as shown in FIG. 14g. The resin layer 103 also includes at least one through-hole that exposes the second auxiliary layer 92.

In step 21 (S21), the fourth electrode 22 of the second photodiode 20 is formed, for example, as shown in FIG. 10. The fourth electrode 22 and the N-type semiconductor 25 may be in contact with the second auxiliary electrode 92.

Following step 21, the second photodiode 20 is completely formed. The second photodiode 20 includes the second electrode 42 of the first photodiode 40 that also serves as the third electrode 21 of the second photodiode 20, the fourth electrode 22, and the semiconductor component (P-type semiconductor 23, the I-type semiconductor 24, and the N-type semiconductor 25) between the third electrode 21/42 and the fourth electrode 22.

When the structures of the sensor transistor 50 and the second switch transistor 60 are different from the structure of the third switch transistor 70, the sensor transistor 50 and the second switch transistor 60 may be formed concurrently during the process(es) of forming the third switch transistor 70, the first photodiode 40, and/or the second photodiode 20. The third power terminal 33 and the read signal line 34 may also be formed concurrently during the process(es) of forming the third switch transistor 70, the first photodiode 40, and/or the second photodiode 20.

In another embodiment of the present disclosure, a method of fabricating the sensor according to the embodiment illustrated in FIG. 16 includes a first patterning step of forming, in the same layer, the gate electrode/light shielding layer 2 of the sensor transistor 50, the at least one signal line 7, and the gate electrode 11 of the first switch transistor 90. The second patterning step forms, in the same layer, the source and drain electrodes 3 of the switch transistor 50, the connection electrode 8, and the source and drain electrodes 14 of the first switch transistor 90. The third patterning step forms, in the same layer, the gate electrode 4 of the sensor transistor 50, the first electrode 41, the gate electrode/light shielding layer 13 of the first switch transistor 90, and the first protective layer 15. The fourth patterning step forms, in the same layer, the second electrode 42, the third electrode 21, and the second protective layer 16.

In another embodiment of the present disclosure, a method of fabricating the sensor according to the embodiment illustrated in FIG. 18 includes a first patterning step of forming, in the same layer, the gate electrode/light shielding layer 2 of the sensor transistor 50, the at least one signal line 7, and the gate electrode 11 of the first switch transistor 90. The second patterning step forms, in the same layer, the source and drain electrodes 3 of the switch transistor 50, the connection electrode 8, and the source and drain electrodes 14 of the first switch transistor 90. The third patterning step forms, in the same layer, the gate electrode 4 of the sensor transistor 50, the gate electrode/light shielding layer 13 of the first switch transistor 90, the second electrode 42, the fourth electrode 22, and the protective layer 20. The fourth patterning step forms, in the same layer, the third electrode 21 and the first electrode 41.

It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

What is claimed is:

1. A sensor, comprising:
   a base substrate;
   a voltage dividing photodiode on the base substrate;
   a detecting photodiode on the base substrate;
   a first power terminal; and
   a second power terminal,
   wherein:
   the voltage dividing photodiode comprises a first electrode, a first P-type semiconductor layer, a first I-type semiconductor layer, a first N-type semiconductor layer, and a second electrode arranged in a stack,
   the detecting photodiode comprises a third electrode, a second P-type semiconductor layer, a second I-type semiconductor layer, a second N-type semiconductor layer, and a fourth electrode arranged in a stack,
   the second power terminal comprises at least one metal layer,
   the first electrode is electrically connected to the first power terminal,
   the second electrode and the third electrode form a unitary structure,
   the fourth electrode is electrically connected to the second power terminal,
   the detecting photodiode is configured to operate with a reverse bias applied by the first power terminal and the second power terminal, so as to detect a light intensity, and
   the unitary structure formed by the second electrode and the third electrode is opaque and covers an entirety of the first electrode, the first P-type semiconductor layer, the first I-type semiconductor layer, and the first N-type semiconductor layer of the voltage dividing photodiode, so that the voltage dividing photodiode is configured to operate substantially permanently in a dark state.

2. The sensor according to claim 1, wherein:
   the voltage dividing photodiode and the detecting photodiode are arranged in a stack, and
   the voltage dividing photodiode is arranged on a side of the detecting photodiode opposite from a light-detecting surface of the detecting photodiode.

3. The sensor according to claim 2, wherein:
   the second electrode is between the first electrode and the detecting photodiode, and
   the third electrode is between the fourth electrode and the voltage dividing photodiode.

4. The sensor according to claim 2, wherein the detecting photodiode substantially covers the voltage dividing photodiode.

5. The sensor according to claim 1, wherein the voltage dividing photodiode does not cover the detecting photodiode.

6. The sensor according to claim 5, wherein a light shielding layer is provided on a light incident side of the voltage dividing photodiode.

7. The sensor according to claim 6, wherein:
the first electrode and the third electrode are provided on the light incident side of the voltage dividing photodiode and a light incident side of the detecting photodiode, respectively, and
the second electrode and the fourth electrode are provided on a side of the voltage dividing photodiode and the detecting photodiode, respectively, opposite from the light incident side.

8. The sensor according to claim 7, wherein the light shielding layer is provided on a light incident side of the first electrode.

9. The sensor according to claim 7, wherein the first electrode is configured as the light shielding layer.

10. The sensor according to claim 8, wherein at least one of (i) the first electrode and the third electrode are provided in the same layer, and (ii) the second electrode and the fourth electrode are provided in the same layer.

11. The sensor according to claim 1, further comprising a sensor transistor,
wherein a gate electrode of the sensor transistor is electrically connected to the third electrode.

12. The sensor according to claim 11, wherein at least one of (i) the gate electrode of the sensor transistor and the third electrode are provided in the same layer, and (ii) the gate electrode of the sensor transistor and the second electrode are provided in the same layer.

13. The sensor according to claim 11, wherein the sensor transistor is a double gate transistor.

14. The sensor according to claim 13, wherein:
the double gate transistor comprises a first gate electrode and a second gate electrode,
the first gate electrode is electrically connected to the third electrode, and
the second gate electrode is electrically connected to the first power terminal.

15. The sensor according to claim 1, further comprising a first switch transistor,
wherein:
a source electrode of the first switch transistor is electrically connected to the second power terminal, and
a drain electrode of the first switch transistor is electrically connected to the fourth electrode.

16. An array substrate comprising a plurality of the sensors according to claim 1.

17. A display panel comprising the array substrate according to claim 16.

* * * * *